(12) United States Patent
Petilli

(10) Patent No.: US 9,595,558 B2
(45) Date of Patent: Mar. 14, 2017

(54) PHOTODIODE ARCHITECTURES AND IMAGE CAPTURE METHODS HAVING A PLURALITY OF PHOTODIODE WITH A SHARED ELECTRODE

(71) Applicant: Intrinsix Corporation, Marlborough, MA (US)

(72) Inventor: Eugene M. Petilli, Victor, NY (US)

(73) Assignee: INTRINSIX CORPORATION, Marlborough, MA (US)

( * ) Notice: Subject to any disclaimer, the term of this patent is extended or adjusted under 35 U.S.C. 154(b) by 134 days.

(21) Appl. No.: 14/539,607

(22) Filed: Nov. 12, 2014

(65) Prior Publication Data

US 2015/0129747 A1    May 14, 2015

Related U.S. Application Data

(60) Provisional application No. 61/902,912, filed on Nov. 12, 2013.

(51) Int. Cl.
  *H01L 27/146* (2006.01)

(52) U.S. Cl.
  CPC .... *H01L 27/14647* (2013.01); *H01L 27/1464* (2013.01); *H01L 27/14621* (2013.01); *H01L 27/14627* (2013.01)

(58) Field of Classification Search
  CPC .............................. H01L 27/146; H01L 31/043
  USPC ......... 250/214 R, 208.1, 214.1, 551; 257/53, 257/59, 428, 443; 327/514, 515
  See application file for complete search history.

(56) References Cited

U.S. PATENT DOCUMENTS

| | | | |
|---|---|---|---|
| 4,661,713 A | 4/1987 | Besson et al. | |
| 4,786,831 A | 11/1988 | Morse et al. | |
| 4,803,363 A | 2/1989 | Gaalema et al. | |
| 5,233,180 A | 8/1993 | Tsuruta et al. | |
| 5,243,177 A * | 9/1993 | Fujimagari | H01L 27/14643 250/208.1 |
| 5,291,293 A | 3/1994 | Kapan | |
| 5,602,511 A | 2/1997 | Woolaway | |

(Continued)

OTHER PUBLICATIONS

U.S. Appl. No. 14/595,383, filed Jan. 13, 2015, Petilli.

(Continued)

*Primary Examiner* — Que T Le
(74) *Attorney, Agent, or Firm* — Daly, Crowley, Mofford & Durkee, LLP

(57) ABSTRACT

A photodiode architecture comprises first, second, and third independent photodiodes, and a shared electrode. The first, second, and third photodiodes are each connected to respective sources of bias voltage and to a common shared electrode, whereby the photodiode architecture comprises at least one of a shared anode and shared cathode photodiode architecture. The photodiode architecture selectively reverse biases the first, second, and third photodiodes so that, during operation, at least one of the first, second and third photodiodes is always operating in a photoconducting mode, to enable capture and storage of charge from any photodiode in the architecture operating in photoconducting mode. Advantageously, the first photodiode can be configured to respond to a first wavelength of light and at least one of the second and third photodiodes can be configured to be responsive to a respective second or third wavelength of light shorter than the first wavelength of light.

20 Claims, 11 Drawing Sheets

Multispectral Pixel Schematic – Shared Anode

(56) References Cited

U.S. PATENT DOCUMENTS

| | | | |
|---|---|---|---|
| 5,856,918 | A | 1/1999 | Soneda et al. |
| 6,252,462 | B1 | 6/2001 | Hoffman |
| 6,455,831 | B1 | 9/2002 | Bandera et al. |
| 6,491,372 | B1 | 12/2002 | Shioya et al. |
| 6,977,601 | B1 | 12/2005 | Fletcher et al. |
| 7,183,531 | B2 | 2/2007 | Olsen et al. |
| 7,492,400 | B2 | 2/2009 | El Gamal et al. |
| 8,314,850 | B2 | 11/2012 | Negishi et al. |
| 8,511,823 | B2 | 8/2013 | Black et al. |
| 9,001,234 | B2 | 4/2015 | Petilli |
| 2002/0180756 | A1 | 12/2002 | Lee et al. |
| 2004/0257078 | A1 | 12/2004 | Porter |
| 2006/0076473 | A1 | 4/2006 | Wilcken et al. |
| 2007/0253695 | A1 | 11/2007 | Miyazawa et al. |
| 2008/0317314 | A1 | 12/2008 | Schwartz et al. |
| 2010/0208092 | A1 | 8/2010 | Wang |
| 2010/0231767 | A1 | 9/2010 | Kikuchi |
| 2010/0283649 | A1 | 11/2010 | Bos et al. |
| 2011/0090024 | A1 | 4/2011 | Chen et al. |
| 2011/0150509 | A1 | 6/2011 | Komiya |
| 2012/0051658 | A1 | 3/2012 | Tong et al. |
| 2012/0113326 | A1 | 5/2012 | Nagaraja et al. |
| 2012/0218445 | A1 | 8/2012 | Petilli |
| 2013/0076553 | A1 | 3/2013 | Kuo et al. |
| 2014/0095102 | A1 | 4/2014 | Potyrailo et al. |
| 2015/0256768 | A1 | 9/2015 | Dolgin et al. |

OTHER PUBLICATIONS

U.S. Appl. No. 14/666,434, filed Mar. 24, 2015, Petilli.
Coath et al., "Advanced Pizel Architectures for Scientific Image Sensors," Rutherford Appleton Laboratory, Science and Technology Facilities Council, UK, https://heplnm061.pp.rl.ac.uk/display/spider/ pp. 57-61.
Notice of Allowance dated Sep. 5, 2014; for U.S. Appl. No. 13/405,406; 10 pages.
Request for Continued Examination dated Oct. 18, 2014; for U.S. Appl. No. 13/405,406; 2 pages.
Notice of Allowance dated December 4, 2014; for U.S. Appl. No. 13/405,406; 11 pages.
312 Amendment dated Feb. 12, 2015, for U.S. Appl. No. 13/405,406; 6 pages.
U.S. Appl. No. 14/490,448, filed Sep. 18, 2014, Petilli.
Dr. Andrew T. Duchowski, Nathan Cournia, and Hunter Murphy, "Gaze-Contingent Displays: Review and Current Trends", CyberPsychology & Behavior. Dec. 2004, 7(6): 621-634. doi:10.1089/cpb.2004.7.621, vol. 7 Issue 6: Feb. 1, 2005.
Maricic, Danijel; "Image Sensors Employing Oversampling Sigma-Delta Analog-to-Digital Conversion with High Dynamic Range and Low Power", Department of Electrical and Computer Engineering Arts, Sciences and Engineering, Edmund A. Hajim School of Engineering and Applied Sciences, University of Rochester, Rochester, NY, 2011, 136 pages.
Tyrrell, Brian, & Berger, Robert, & Colonero, Curtis, &Costa, Joseph, & Kelly, Michael, & Ringdahl, Eric, & Schultz, Kenneth, & Wey, James of Lincoln Laboratory, Massachusetts Institute of Technology. Design Approaches for Digitally Dominated Active Pixel Sensors: Leveraging Moore's Law Scaling in Focal Plane Readout Design. This work was sponsored by the United States Government under Air Force contract FA8721-05-C-0002.
Tyrrell, Brian, & Anderson, Kirk, & Baker, Justin, & Berger, Robert, & Brown, Matthew, & Colonero, Curtis & Costa, Joseph, & Holford, Brian, & Kelly, Michael, & Ringdahl, Eric, & Schultz, Kenneth , & Wey, James. Time Delay Integration and In-Pixel Spatiotemporal Filtering Using a Nanoscale Digital CMOS Focal Plane Readout. *IEEE Transactions on Electron Devices*, vol. 56, No. 11, Nov. 2009.
Kelly, Michael, & Colonero, Curtis, & Tyrrell, Brian, & Schultz, Kenneth Of Lincoln Laboratory, Massachusetts Institute of Technology. The Digital Focal Plane Array (DFPA) Architecture for Data Processing "On-Chip" Mil. Sens. Symp.Detector Spec. Gp., Feb. 2007, This work was sponsored by the United States Government under Air Force contract FA8721-05-C-0002.
Hill, Cory J., & Soibel, Alexander, & Keo, Sam A., & Mumolo, Jason. M., & Gunapala, Sarath. D. of Jet Propulsion Laboratory, California Institute of Technology, & Rhiger, David R., & Kvaas, Robert E., & Harris, Sean F of Raytheon Vision Systems. Infrared Imaging Arrays Based on Superlattice Photodiodes. *Infrared Technology and Applications XXXIV*, edited by BjØrn F. Andresen, Gabor F. Fulop, Paul R. Norton, *Proc. of SPIE* vol. 6940, 69400C, (2008) • 0277-786X/08 doi: 10.1117/12.783934.
Chen, Leonard, Hewitt, Mary, & Guibransen, Dave,& Pettijohn, Kevin, & Chen, Bryan, & Wyles, Richard of the Raytheon Infrared Center of Excellence. Overview of advances in high performance ROIC designs for use with IRFPAs.
Das, Sankha dip, & Tan, Siew Li, & Zhang, Shiyong, & Goh, Yu Ling,& Tan, Chee Hing, & David, John of The Department of Electronic & Electrical Engineering, University of Sheffield. Development of LWIR Photodiodes Based on InAs/ GaSb Type II Strained Layer Superlattices. *6th EMRS DTC Technical Conference*—Edinburgh 2009.
Johnson, J. L., & Samoska, L. A., & Gossard, A. C. of The Department of Electrical and Computer Engineering, University of California, Santa Barbara, & Merz, J. L. of The Department of Electrical Engineering, University of Notre Dame, & Jack, M. D., & Chapman, G. R., & Baumgratz, B. A., & Kosai, K., & Johnson, S. M. of The Santa Barbara Research Center. Electrical and optical properties of infrared photodiodes using the InAs/Ga12xInxSb Superlattice in Heterojunctions with GaSb *J. Appl. Phys.* 80 (2), Jul. 15, 1966 0021-8979/96/80(2)/1116/12/$10.00.
Smith, D.L., of The Los Alamos National Laoratory, & Maihiot, C.of The Xerox Webster Research, Webster, NY. Proposal for Strained Type II Superlattice Infrared Detectors *J. Appl. Phys.* 62(6), Sep. 15, 1987 0021-8979/87/182545-04.
Zheng, L., & Tidrow, M. Z., & Novello, A., & Weichel, H., Vohra, S. Type II strained Layer Superlattice: A Potential Infrared Sensor Material for Space. *Quantum Sensing and Nanophotonic Devices V*, edited by Rengarajan Sudharsanan, Christopher Jelen. *Proc. of SPIE* vol. 6900, 69000F, (2008) • 0277-786X/08 • doi: 10.1117/12.768420.
Tennant, W.E., & Lee, Donald, & Zandian, Majid, & Piquet Eric, & Carmody, Michael Of Teledyne Imaging Sensors. MBE HgCdTe Technology—A Very General Solution To IR Detection, Described by "Rule 07", a Very Convenient Heuristic.
Kavusi et al., "Wuantitative Study of High Dynamic Range Sigma Delta-based Focal Plane Array Architectures", Department of Electrical Engineering, Stanford University, Stanford, CA 94305, Infrared Technology and Applications XXX, edited by Bjorn F. Andresen, Gabor F. Fulop, Proc. of SPIE vol. 5406 (SPIE, Bellingham, WA, 2004) 0277-786X/04/$15—doi: 10.1117/12.548875, 10 pages.
Mendis et al., "Design of a Low-Light-Level Image Sensor with On-Chip Sigma-Delta Analog-to-Digital Conversion", 0-8194-1133-7/93/$6.00; SPIE vol. 1900, 9 pages. (c) 1993: SPIE—The International Society for Optical Engineering.
U.S. Appl. No. 14/490,448 Notice of Allowance dated Jan. 29, 2016, 22 pages.
Restriction Requirement dated Jan. 22, 2016; For U.S. Appl. No. 14/595,383; 6 pages.
Response dated Mar. 22, 2016 to Restriction Requirement dated Jan. 22, 2016; For U.S. Appl. No. 14/595,383; 2 pages.
Notice of Allowance dated Mar. 28, 2016; For U.S. Appl. No. 14/666,434; 20 pages.
Office Action dated Apr. 8, 2016; For U.S. Appl. No. 14/595,383; 25 pages.
U.S. Appl. No. 14/595,383 Amendment filed on Sep. 8, 2016 29 pages.

\* cited by examiner

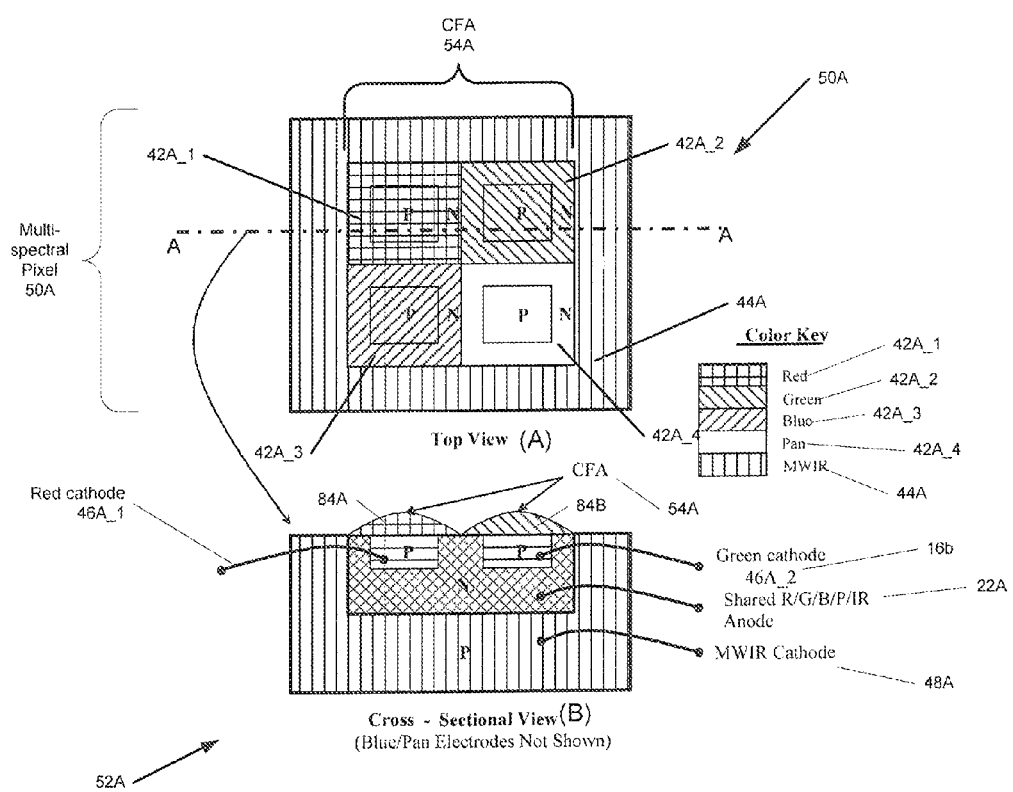

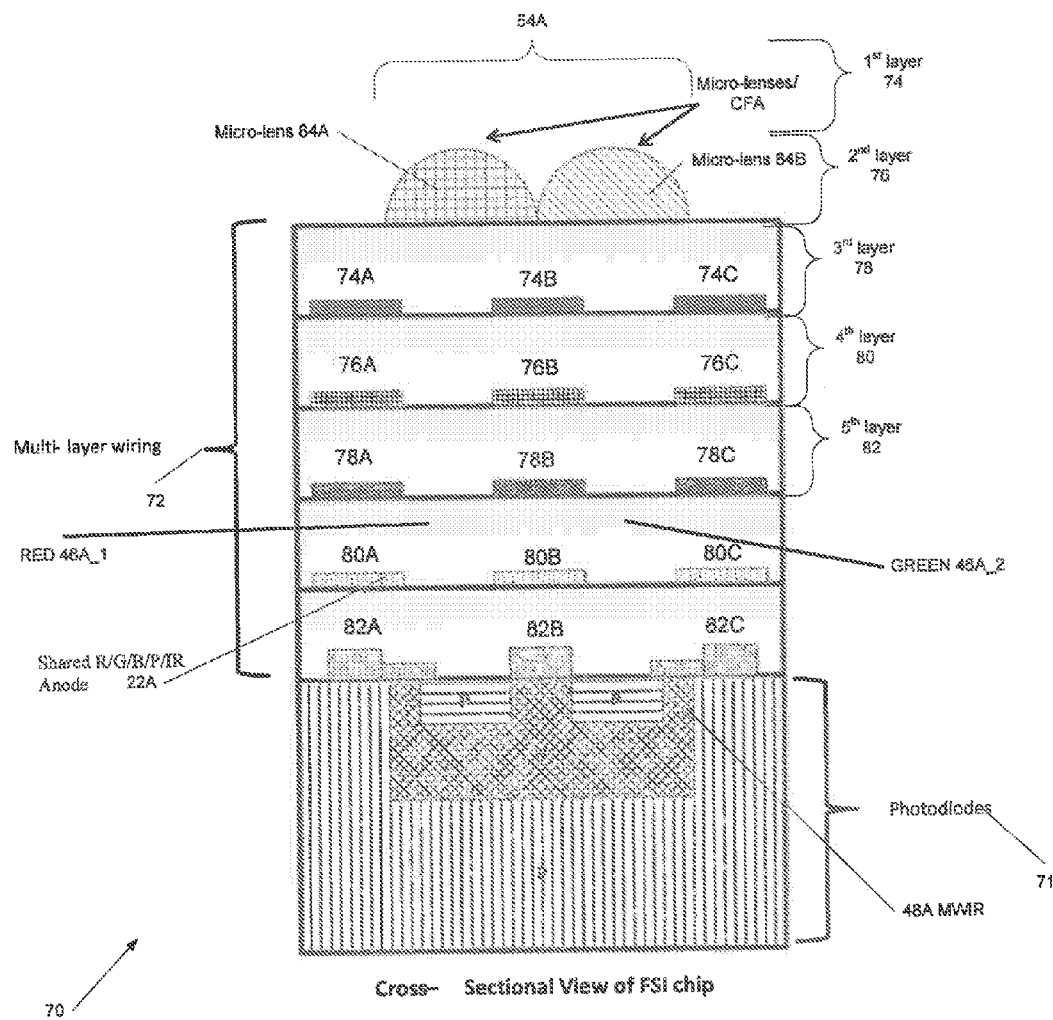
4E

Top View of BSI Pixel

Cross – Sectional View of BSI chip Along B-B line

Top View of BSI Pixel

Cross – Sectional View of BSI chip

Multispectral Array

Color Key

Red
Green
Blue
Pan
MWIR

PHOTODIODE ARCHITECTURES AND IMAGE CAPTURE METHODS HAVING A PLURALITY OF PHOTODIODE WITH A SHARED ELECTRODE

CROSS REFERENCE TO RELATED APPLICATION

This application claims priority to U.S. Provisional Application filed on Nov. 12, 2013, having Ser. No. 61/902,912, by Eugene M. Petilli, entitled "Stacked Photodiode Multispectral Imager," which is hereby incorporated by reference in its entirety.

FIELD

This disclosure is broadly related to imaging systems and semiconductor manufacturing. In particular, at least some embodiments described herein are related to stacked photodiode architectures. In at least some embodiments, disclosures are provided relating to Stacked Photodiode Multispectral Imager systems, methods, and devices.

This application also is intended to be usable with many different types of systems that use photodiodes, including imaging systems, especially those that are based on sigma-delta modulators (SDM), including but not limited to systems, methods, and apparatuses such as the Imager Readout Architecture utilizing analog to digital (A/D) converter, which was described in commonly assigned, published United States patent application number 20120218445 (which application is hereby incorporated by reference) (hereinafter "'445 application"), which was published on Aug. 30, 2012, filed on Feb. 27, 2012, and which claims priority to Provisional Patent Application No. 61/446,582, filed Feb. 25, 2011, entitled "Imager Readout Architecture Utilizing A/D Converters (ADC)," listed inventor Eugene M. Petilli (now U.S. Pat. No. 9,001,234, issued Apr. 7, 2015 and U.S. Pat. No. 9,369,651, issued Jun. 14, 2016). This application also is intended to be usable with the commonly owned application entitled Foveal Imager Readout Integrated Circuit (ROIC), application Ser. No. 61/879,276, listed inventor Eugene M. Petilli, and filed on Sep. 18, 2013 (now U.S. Pat. No. 9,344,660, issued May 17, 2016). All of the applications listed in this paragraph are hereby incorporated by reference in their entirety.

BACKGROUND

Photodiodes are diodes that are capable, when properly biased, of generating hole-electron pairs when exposed to light, which can result in generation of either a current or voltage. For example, a photocurrent can be generated when light is absorbed in the depleted region of this type of junction semiconductor. An applied reverse bias voltage, to a photodiode, effectively increases the width of the photodiode's depletion junction, producing an increased responsivity, a decrease in junction capacitance, and a very linear response. Some diodes that are used specifically as photodiodes are fabricated using a PIN junction, rather than a p-n junction, to increase speed of the diode's response. The magnitude of the generated photocurrent is proportional to the light intensity and also depends on the frequency of the light.

In contrast, in the so-called photovoltaic mode of a photodiode, there is zero bias of the photodiode, so that, when the photodiode is illuminated, there is a very restricted flow of current out of the diode and a voltage build-up, to exploit the photovoltaic effect. This enables the photodiode operating in this mode to be a source of power (thus photovoltaic mode operation is useful when photodiodes are used as part of solar cells).

Applications of photodiodes, whether operating in photoconductive or photovoltaic mode, include, but are not limited to, devices such as cameras, light detectors, CT scanners, x-ray devices, safety equipment such as smoke detectors, x-ray machines at airports, security systems (e.g., airport x-ray systems), energy systems (e.g., solar cells), industry applications (e.g., bar code scanners, remote controls), military systems (e.g., night vision systems), and many other applications, as those of skill in the art will appreciate.

SUMMARY

One application of a photodiode operating in the photoconductive mode is as a photodetector. When used as a photodetector, the photodiode converts light that is illuminating the photodiode into an output that is proportional to the light level. Typically, the light is let into the diode either via a "window" on the device itself or via an optical fiber directly coupled to the device. The output of a photodiode can be either current or voltage, depending upon the mode of operation of the photodiode. In addition, the materials used for fabrication of the photodiode can be selected to optimize response at certain wavelengths of light. For example, certain types of silicon pn junctions can be used to sense light at near infrared wavelengths and for visible light spectra (e.g., around 0.9 µm). Other materials are used for different light spectra, as will be appreciated by those of skill in the art.

An arrangement of photodiodes that is particularly useful in camera and other imaging applications is the stacked photodiode configuration. In a stacked photodiode arrangement, the photodiodes are arranged in sequential layers along an optical path, with each layer (i.e., photodiode) configured to absorb energy (e.g., photons) within a predetermined energy range. Varying the materials used to fabricate the photodiodes enables manufacture of stacked diode junctions at depths that are capable of separating photons of various wavelengths, using, for example, standard CMOS manufacturing processes, or an integrated circuit fabricated using gallium arsenide (GaAs) or other non-silicon process. This can enable each sequential layer to separate out a specific color.

For example, one application for stacked photodiodes is as image sensors. Image sensors are integrated circuit devices having circuitry capable of transforming transform incident light into one or more electrical signals configured to be proportional to the intensity and color information of the incident light, within a predetermined resolution. Image sensors include sensors such as front side illuminated (FSI) image sensors and back side illuminated (BSI) image sensors.

FSI image sensors have photodiodes formed on a given chip, with circuitry built on top of the photodetector. Other components, such as a color filter array (CFA) and/or one or more micro lenses, can be added on top of the circuitry built on top of the photodetector. Because FSI image sensors are front side illuminated, light does not reach the photodiode (which is acting as a photodetector) until it first passes through the layers of circuitry. For example, in an exemplary FSI configuration, light falls on the front side of the pixel circuitry, and passes through various circuits (e.g., readout circuits), then the light interconnects before the photodetector collects it, similar to the way the human retina operates (in the human retina, where the light passes through interconnected layers of tissue that contain various nerve cells, then is later detected by the rods and cones of the eye.

With the BSI image sensor, light enters through the back (substrate side) of the device, through the substrate and to the photodiode, without needing first to pass through the layers of circuitry or layers of interconnects. In some instances, BSI photodetectors can have a higher sensitivity in a broader spectrum than the FSI photodetectors.

The following presents a simplified summary in order to provide a basic understanding of one or more aspects of the disclosed embodiments. This summary is not an extensive overview of the embodiments described herein, and is neither intended to identify key or critical elements, nor to delineate the scope thereof. Rather, the primary purpose of the summary is to present some concepts of at least some of the embodiments in a simplified form as a prelude to the more detailed description that is presented later.

FIG. 1 illustrates a schematic representation of an exemplary basic stacked photodiode unit 10, as is known in the prior art. For example, known stacked photodiodes can be made using strained layer superlattice (SLS) material (made from GaAs) with a structure similar to that shown in FIG. 1, where one diode is tuned for long wave infrared (LWIR) and other diode tuned for medium wave infrared (MWIR).

The photodiode 10 includes an LWIR diode 11 and a medium wavelength infrared (MWIR) diode 14, a first electrode 16 (which in this figure corresponds to the cathode of the LWIR photodiode 11) and a second electrode 18 (which in this schematic corresponds to the cathode of the MWIR diode 14). The LWIR diode 11 and the MWIR diode 14 are coupled in series, in a diode stack, such that the anode of the LWIR diode 11 is connected to the anode of the MWIR diode 14, the cathode of the LWIR diode 11 is connected to a bias voltage at a first polarity, and the cathode of the MWIR diode is connected to the bias voltage at the opposite polarity. When either photodiode 11, 14 is reverse biased, (i.e. its anode=negative, its cathode=positive), that respective photodiode 11, 14 becomes photoconducting. When either photodiode is forward biased (i.e. its anode=positive, its cathode=negative), the respective photodiode is no longer photoconducting and, thus, no longer active in the circuit 10 as an imaging component.

For example, as shown in FIG. 1, to enable LWIR photoconducting (i.e., operation of the LWIR diode 11 in reverse bias mode), the "LWIR Bias" potential is applied across the entire stacked structure, from the first electrode 16 to the second electrode 18, thus disabling MWIR photoconducting. To enable MWIR diode 14 photoconducting, the "MWIR Bias" is applied across the entire stacked structure 10 (i.e., second electrode 18 is at a positive voltage for MWIR bias, first electrode 16 at a negative voltage for MWIR bias), thus disabling LWIR wavelength photoconducting (i.e., putting the MWIR diode 14 in a reverse bias mode).

One potential disadvantage of the stacked photodiode structure 10 of FIG. 1, however, is the time-multiplexing of the alternating bias required between rows or frames in order to retrieve both LWIR and MWIR bands. In anticipation of applications requiring tighter temporal coupling between bands, in accordance with another embodiment described herein, a stacked photodiode architecture has been developed. For example, in one embodiment, the stacked photodiode architecture includes an enhanced, improved, and modified version of the basic stacked structure of FIG. 1. For example, one application that may require such tighter temporal coupling between bands is for high speed video systems, such as motion tracking systems. At least some embodiments discussed herein may have applicability to other types of tracking systems, such as missile tracking systems. For example, in one exemplary embodiment, the stacked photodiode structure of FIG. 2 (described further herein) is used as part of a system for tracking ballistic missiles, which system is required to track at up to 2000 frames per second (FPS). As a point of contrast, a typical television requires tracking in the range of 48-60 FPS.

A further advantage of at least some embodiments described herein is adding further capabilities to existing systems and to new systems. For example, the ability to selectively capture IR and visible using the same device, as is possible with at least some embodiments of the modified and enhanced stacked photodiode configuration discussed herein, is highly desirable. Being able to selectively capture IR images and visible images using the same device is a significant improvement over having to use two separate cameras, which require two optics paths, resulting in a configuration that is much bigger and heavier than what is proposed for at least some embodiments herein.

In addition, at least some embodiments described herein have applicability to systems such as image fusion systems. As is known in the art, an image fusion system is an imaging system that combines relevant information from more than one image, into a single image. It is particularly useful to be able to view visible and IR within the same image, especially for applications where use of IR images can compensate for various deficiencies and/or limitations in the visible image. One example application is of image fusion is facial recognition systems, where visible images used for identification often can be difficult to use because of shadows, lighting conditions, facial expression, facial hair, etc., but where IR images can provide an image that is independent of these variables. There are also a number of useful security and military applications for image fusion, especially of visible and IR images, including but not limited to use in connection with target tracking by unmanned aerial vehicles (UAVs)), use with surveillance images, use on military vehicles, etc.

In one embodiment of an enhanced structure, discussed further herein, the at least one embodiment takes advantage of several inherent light qualities to construct a stacked photodiode circuit capable of responding to both infrared (IR) light and visible (e.g., colored) light. Because IR light has a long wavelength (e.g., on the order of twelve (12) to thirty (30) μm), one embodiment, discussed further herein in connection with FIGS. 2-5, includes one diode that is, relative to the other diodes, physically "large", and this larger diode is used for response to IR light. Within the physically larger IR diode, four smaller diodes (e.g., smaller than 12 μm, but this is not limiting—the smaller diodes need only be "small" relative to the physically larger IR diode) are embedded for visible light which has a corresponding smaller wavelength. A color filter array (CFA) is used in connection with the proposed design to break the visible light into the visible colors. In addition, note that presently used cameras used to capture visible images often use pixels having a size of less than one (1) μm.

In one embodiment, a photodiode architecture is provided, the photodiode architecture comprising first, second, and third photodiodes, and a shared electrode. The first photodiode comprises first and second electrodes, the second electrode being operably coupled to a first source of bias voltage at a first potential, the first electrode being coupled to the shared electrode. The second photodiode is operably connected in series with the first photodiode, the second photodiode being independent of the first photodiode, comprising third and fourth electrodes, the fourth electrode being operably coupled to a second source of bias voltage at the first potential, the third electrode being coupled to the shared electrode. The third photodiode is operably connected in series with the first photodiode, the third photodiode being independent of the first photodiode and comprising fifth and sixth electrodes, the sixth electrode being operably coupled to a third source of bias voltage at the first potential and the fifth electrode being coupled to the shared electrode. The shared electrode node is in operable communication with the first electrode, third electrode, and fifth electrode. The photodiode architecture comprises at least one of a shared anode photodiode architecture and a shared cathode photodiode architecture, wherein the shared electrode node is configured to operate, respectively, as either a shared anode node or a shared cathode node for the respective first, second, and third photodiodes, wherein the first photodiode, second photodiode, third photodiode and shared electrode are constructed and arranged to selectively reverse bias the first, second, and third photodiodes so that, during operation, at least one of the first, second and third photodiodes is always operating in a photoconducting mode, to enable capture and storage of charge from any photodiode in the photodiode architecture that is operating in photoconducting mode.

In a further embodiment, the photodiode architecture is configured as part of a front-side-illumination device. In another embodiment, the photodiode architecture is configured as part of a back-side illumination device. In one embodiment, the first photodiode is configured to respond to a first wavelength of light and at least one of the second and third photodiodes is configured to be responsive to a respective second or third wavelength of light that is shorter than the first wavelength of light. In another embodiment, at least one of the first, second, and third photodiodes is configured to be responsive to non-visible light and at least one of the first, second and third photodiodes is configured to be responsive to visible light. For example in one embodiment, the second and third photodiodes are each constructed and arranged to be responsive to a respective one of visible red light, visible green light, visible blue light, and visible panchromatic light. In another embodiment, wherein the first photodiode is constructed and arranged to be responsive to any one of infrared light, near infrared (NIR) light, short-wavelength infrared (SWIR) light, long wavelength infrared (LWIR) light, ultraviolet (UV) light, radio wave light, x-ray wave light, and gamma ray light. In still another embodiment, any two of the first, second, and third photodiodes are responsive to the same type of light.

In one embodiment, the photodiode architecture further comprises a color filter array (CFA) configured to be in operable communication with the first, second, and third photodiodes. In one embodiment, the first, second, and third photodiodes are arranged in a stacked configuration. In one embodiment, the photodiode architecture is implemented as part of at least one of an image capture device and an image fusion system.

In another aspect, a multispectral pixel device is provided. The multispectral pixel device comprises a non-visible pixel layer, a shared electrode layer, and a multicolored pixel layer. The non-visible pixel layer comprises a layer of semiconductor material constructed and arranged to be responsive to at least a first type of non-visible light and also comprising a first electrode coupled to a first bias voltage. The shared electrode layer is formed on top of at least a portion of the non-visible pixel layer, the electrode comprising one of a cathode and an anode. The shared electrode layer is formed so as to leave at least a portion of the non-visible pixel layer exposed, the shared electrode layer comprising a layer of semiconductor material constructed and arranged to provide an electrode layer shareable by the non-visible pixel layer and a multicolored pixel layer.

The multicolored pixel layer is formed on top of at least a portion of the shared electrode layer, the multicolored pixel layer formed so as to leave at least a portion of the shared electrode layer exposed, the multicolored pixel layer sharing an electrode with the non-visible pixel layer. The multicolored pixel layer comprises first and second pixel portions. The first pixel portion comprises a first region of material that is responsive to a first type of visible light, the first pixel region further comprising a respective first pixel electrode, the first pixel electrode comprising at least one of an anode and a cathode, wherein the first pixel electrode comprises a different type of electrode than the shared electrode, the first pixel electrode operably coupled to a respective source of first pixel bias voltage. The second pixel portion comprises a second pixel region of material that is responsive to a second type of visible light, the second pixel region further comprising a respective second pixel electrode, the second pixel electrode being the same type of electrode as the first pixel electrode and being operably coupled to a respective source of second pixel bias voltage.

The nonvisible pixel layer, multicolored pixel layer, and shared electrode layer are constructed and arranged so that, during operation, at least one photodiode formed in the nonvisible pixel layer and multicolored pixel layer is always operating in a photoconducting mode, to enable capture and storage of charge for the photodiode in the device that is operating in photoconducting mode.

In a further embodiment, the multispectral pixel device further comprises a color filter array (CFA) layer operably configured to be in operable communication with the multicolored pixel layer. In another embodiment, the multispectral pixel device further comprises a plurality of multispectral pixel devices arranged in an array. In a further embodiment, the CFA comprises an RGBW PANchromatic filter. In another embodiment, the non-visible pixel layer comprises a layer of semiconductor material, the material comprising at least one of n-type material and p-type material, wherein the semiconductor material is responsive to non-visible light, the non-visible light selected from the group consisting of infrared light, near infrared (NIR) light, short-wavelength infrared (SWIR) light, long wavelength infrared (LWIR) light, ultraviolet (UV) light, radio wave light, x-ray wave light, and gamma ray light.

In one embodiment, the multicolored pixel layer comprises:

a red pixel portion, the red pixel portion comprising a first region of semiconductor material, the semiconductor material comprising one of n-type and p-type material, the semiconductor material being responsive to visible red light, the red pixel region further comprising a respective red electrode, the red electrode comprising one of an anode and a cathode and being operably coupled to a respective source of red pixel bias voltage;

a green pixel portion, the green pixel portion comprising a second region of semiconductor material, the semiconductor material comprising one of n-type and p-type material, the semiconductor material being responsive to visible green light, the green pixel region further comprising a respective green electrode, the green anode comprising one of an anode and a cathode and being operably coupled to a respective source of green pixel bias voltage;

a blue pixel portion, the blue pixel portion comprising a third region of semiconductor material, the semiconductor material comprising one of n-type and p-type material, the semiconductor material being responsive to visible blue light, the blue pixel region further comprising a respective blue electrode, the blue electrode comprising one of an anode and a cathode and being operably coupled to a respective source of blue pixel bias voltage; and a panchromatic pixel portion, the panchromatic pixel portion comprising a fourth region of semiconductor material, the semiconductor material comprising one of n-type and p-type material, the semiconductor material being responsive to visible panchromatic light, the panchromatic pixel region further comprising a respective panchromatic electrode, the panchromatic electrode comprising one of an anode and a cathode and being operably coupled to a respective source of panchromatic pixel bias voltage;

wherein the nonvisible pixel layer, multicolored pixel layer, and shared electrode layer are constructed and arranged so that, during operation, at least one photodiode formed in the nonvisible pixel layer and multicolored pixel layer is always operating in a photoconducting mode, to enable capture and storage of charge for the photodiode in the device that is operating in photoconducting mode.

In one embodiment, the multispectral pixel device is configured as part of a front side illumination device. In one embodiment, the multispectral pixel device is configured as part of a back side illumination device.

In yet another aspect, a method for capturing an image is provided. The method comprises:

providing a first photodiode having first and second electrodes, the second electrode being operably coupled to a first source of bias voltage at a first potential;

coupling the first electrode to a shared electrode;

operably connecting a second photodiode in series with the first photodiode, the second photodiode being independent of the first photodiode and having third and fourth electrodes, the fourth electrode being operably coupled to a second source of bias voltage at the first potential and the third electrode being coupled to the shared electrode;

operably connecting a third diode in series with the first photodiode, the third photodiode being independent of the first photodiode and comprising fifth and sixth electrodes, the sixth electrode being operably coupled to a third source of bias voltage at the first potential and the fifth electrode being coupled to the shared electrode, wherein the shared electrode is in operable communication with the first, third, and fifth electrodes;

configuring the first photodiode to respond to a first wavelength of light and at least one of the second, and third photodiodes to be responsive to a respective second or third wavelength of light that is shorter than the first wavelength of light;

configuring an electrode node that is in operable communication with the first electrode and the third electrode to be a shared electrode that is configured to operate, respectively, as either a shared anode or a shared cathode for the first, second, and third photodiodes, respectively, wherein the photodiode architecture comprises at least one of a shared anode photodiode architecture and a shared cathode photodiode architecture, wherein the shared electrode node is configured to operate, respectively, as either a shared anode node or a shared cathode node; and constructing and arranging the first photodiode, second photodiode, third photodiode, and shared electrode to selectively reverse bias the first, second, and/or third photodiodes so that, during operation, at least one of the first, second, and third photodiodes is always operating in a photoconducting mode, to enable capture and storage of charge from any photodiode in the photodiode architecture that is operating in photoconducting mode.

Details relating to these and other embodiments are described more fully herein.

BRIEF DESCRIPTION OF THE FIGURES

The advantages and aspects of at least some of the embodiments disclosed herein will be more fully understood in conjunction with the following detailed description and accompanying color drawings, in which:

FIG. 4A is a top schematic view of a physical pixel layout, shared anode configuration, for a first Front Side Illuminated (FSI) multispectral pixel in accordance with one embodiment;

FIG. 4B is a cross-sectional schematic view of the possible physical pixel layout of FIG. 4A, shared anode configuration, for a first FSI multispectral pixel, taken along the A-A line, in accordance with one embodiment;

FIG. 4E is a cross-sectional schematic view of a physical pixel layout, shared anode configuration, for a third FSI pixel, showing the multi-layer wiring, implemented using a third multispectral pixel, including micro-lenses forming a color filter array (CFA), in accordance with one embodiment;

The drawings are not to scale, emphasis instead being on illustrating the principles of the described embodiments. In addition, in the drawings, like reference numbers indicate like elements.

DETAILED DESCRIPTION

Figure 1:
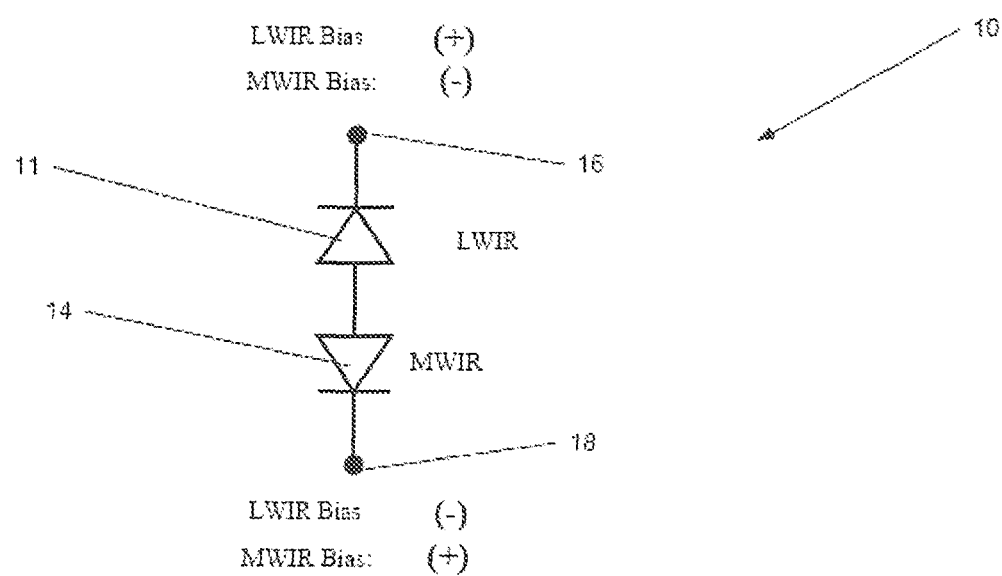
FIG. 1 illustrates a schematic representation of a prior art basic stacked photodiode unit.
Figure 2A:
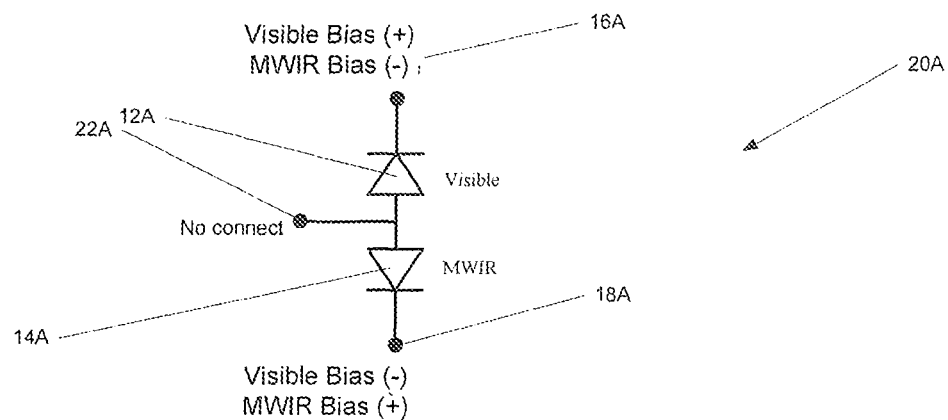
FIG. 2A illustrates a first enhanced and modified version of the basic stacked structure of FIG. 1, showing an exemplary shared anode configuration, in accordance with one embodiment.
Figure 2B:
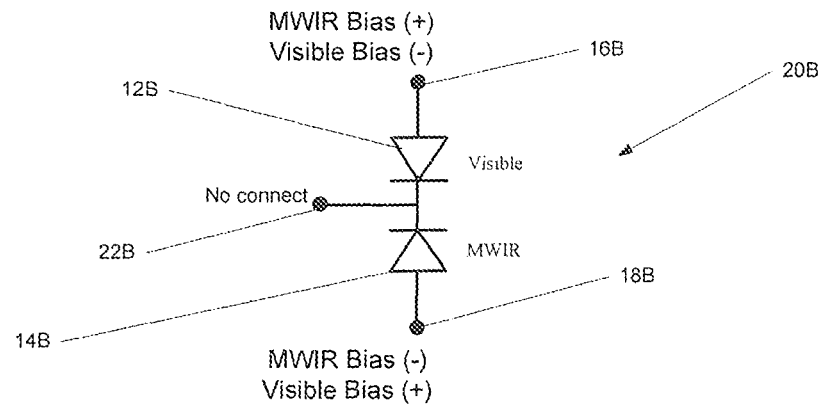
FIG. 2B illustrates a second enhanced and modified version of the basic stacked structure of FIG. 1, showing an exemplary shared cathode configuration, in accordance with one embodiment.

Reference is now made to FIGS. 2A and 2B, which each illustrate a respective enhanced and modified version, respectively, of the basic stacked structure 10 of FIG. 2 ("enhanced diode 20A, 20B"), in accordance with one embodiment. The stacked structures illustrated in FIGS. 2A and 2B (as well as the structures and pixel layouts, etc., shown in FIGS. 3A-5E, described further below) are, in at least some embodiments, part of a useful and new photodiode architecture that has applications in many other assemblies, systems, methods and devices. For example, in some embodiment, the photodiode architecture is implemented as part of a multispectral pixel device. In another embodiment, the photodiode architecture is implemented as part of an image capture device. In a further embodiment, the photodiode is implemented as part of an image fusion system. In still further embodiments, the photodiode architecture is implemented into a multispectral pixel device that itself is incorporated into either an image capture device or an image fusion system. In still further embodiments, the photodiode architecture is provided and used as part of a method for capturing an image. These and other embodiments are described further herein.

FIG. 2A illustrates a shared anode configuration 20A, and FIG. 2B illustrates a shared cathode configuration 20B. In the enhanced diode architectures 20A, 20B shown in each of FIGS. 2A and 2B, respectively, a third electrode 22 is introduced which enables reverse biasing of both photodiodes 12, 14 thus allowing for capture and storage of charge from both the visible and MWIR photodiodes. This third electrode can serve as either an anode or cathode, depending on the configuration, as will be appreciated. In addition, in the enhanced diode architectures 20A, 20B, a visible diode 12 replaces the LWIR diode 11 (this is not limiting, as will be discussed below).

Advantageously, in either of the enhanced configurations 20A, 20B, with the voltages applied as shown, the unselected photodiode(s) (i.e., the diode(s) that are not desired to be photoconducting) is/are connected so as to be forward biased, and the selected photodiode(s) (i.e., the diode(s) that are desired to be photoconducting) is/are connected so as to be reverse biased. In one embodiment, multiple visible diodes 12 are provided for a color with a shorter wavelength and a single diode 14 is provided for the color with longer wavelength (applicable to shared electrode configurations (i.e., both the shared anode and shared cathode configurations); see also FIGS. 3A and 3B, discussed further herein). In one embodiment, the diode arrangement 20 includes one diode in photoconductive mode and one diode in forward bias (nonphotoconductive) mode.

Note, as shown in FIG. 2A, that the third electrode 22A (which serves, in FIG. 2A, as a shared anode for the visible diode 12A and MWIR diode 14A), although not connected to a bias voltage source, is, in at least one embodiment, effectively at a negative potential, relative to the cathode 16A of the visible diode 12A and to the cathode 18A of the MWIR photodiode 14A. As a result, there is, in one embodiment, generally no period of time during capture and readout in which one of the photodiodes does not convert light into stored charge. That is, one of the photodiodes 12A, 14A is always able to be photoconducting, in any given instant, if the respective photodiode 12A, 14A has the appropriate bias voltage at its respective cathode 16A, 18A. It is possible, in one embodiment, to apply, at the same time, a first appropriate bias voltage to both the cathode 16A of the visible diode 12A and the cathode 18A of the MWIR diode 14A, while effectively maintaining the unconnected common electrode 22A (i.e., common anode 22A, for this configuration), at a second appropriate bias voltage, to ensure that that both photodiodes 12A, 14A are reverse biased at the same time, and thus photoconducting simultaneously.

In one embodiment, the exemplary enhanced structure 20A of FIG. 2A, always has one of the two stacked photodiodes 12A, 14A, active as a photodiode. Of course, as will be appreciated, in at least some embodiments, certain situations may arise where at least one of the stacked photodiodes might not be active. For example, if there is zero bias voltage across both diodes, then neither of the stacked photodiodes may be active. In another example embodiment, during a reset phase, the photodiode that is active is, as part of the reset operation, intentionally shorted to a known bias voltage, and photocurrent from that diode is, effectively, "thrown away" and not used for any photodetecting purposes.

The enhanced structure 20A of FIG. 2A operates, in one embodiment, as follows. Assume first that a positive bias voltage is applied to the cathode 16A of the visible diode 12A. The unconnected electrode 22A is, in one embodiment, at a negative potential relative to the positive bias voltage. In this first example, while these voltages are applied, the visible diode 12A is reverse biased and is, therefore, generating a photocurrent that is proportional to the light intensity that the visible diode 12 is receiving. At the same time, because of the third unconnected electrode 22A being at a negative potential, if a positive voltage also is applied to the MWIR diode 14A, then the MWIR diode 14A also is reverse biased (e.g., at the same time that the visible diode 12A is reverse biased).

As further discussed below in connection with FIGS. 3A and 3B, for a longer wavelength, larger photodiode, in one embodiment, one color is collected (some range of wavelengths determined by the responsiveness of the photodiode material). For the multiple smaller photodiodes, multiple colors are captured, determined by the cascade of the Color Filter Array (CFA) and the photodiode material. This is discussed further herein.

In a further embodiment (e.g., FIG. 2B), a first electrode 16B serves as the anode for the visible photodiode 12B, and a second electrode 18B serves as the anode for the MWIR photodiode 14B, and, and, thus, the third electrode 22B serves as a shared or common cathode used for both the visible photodiode 12B and for the MWIR photodiode 14B. It will be understood by those of skill in the art that the configuration in FIG. 2B showing a visible diode 12B coupled to an MWIR diode 12B, with a shared cathode 22B, is not limited to this particular arrangement or selection of photodiodes. In another embodiment, the MWIR photodiode 14B is in the "top" position of FIG. 2B, and the visible photodiode 12B is in the "bottom" position of FIG. 2B. In still another embodiment, the MWIR photodiode 14B is replaced by a different type of photodiode 14B that is associated with one or more non-visible light wavelengths, e.g., such as near infrared (NIR), short-wavelength infrared (SWIR), long wavelength infrared (LWIR), ultraviolet (UV), radio, x-ray, gamma ray, etc. Furthermore, in another embodiment, the visible wavelength diode 12B is replaced with a different non-visible wavelength diode.

So, for example, the configuration of FIG. 2B, in one embodiment, includes any two modes of photoconductive operation, one for each diode in the stack. As one example embodiment, the diode 12B is an SWIR diode and the diode 14B is an LWIR diode. Or, in another example embodiment, the diode 12B is a visible red diode and the diode 14B is a visible green diode. In other words, virtually any combination of photodiodes, whether visible or non-visible, is usable with the shared cathode configuration of FIG. 2A or 2B, as will be appreciated.

This, it will be appreciated that the aforementioned discussion above for the shared cathode configuration of FIG. 2B is equally applicable to the "shared anode" configuration of FIG. 2A, but with the appropriate information reversed, as will be well understood.

To provide wavelength discrimination between the visible 12 and MWIR 14 photodiodes respectively, in the initial bulk silicon prototype implementation, in at least one embodiment, varying dopant levels between photodiodes and introducing a color filter array (CFA) 54 (see FIGS. 4A-4E and 5A-5D) for the visible wavelength photodiodes helps to achieve wavelength discrimination between the visible photodiodes 12 and MWIR photodiodes 14. Further, although the embodiments described herein are described in connection with a CFA 54, these embodiments are usable with other technologies, whether now known or developed in the future, which duplicate or replace at least some of the functionality of the CFA. The described device 20, regardless of whether a CFA or any other filter is used with it; still functions, in one embodiment, as a two color device (e.g., visible black/white and non-visible, e.g., IR) even without use of a CFA 54 or other filter. At least some embodiments of the device 20 described herein are not dependent on any specific CFA 54 or other filter.

As will be appreciated, a CFA (also known as a color filter mosaic (CFM)), is an array of color filters placed over the pixel sensors of an image sensor to capture color information. There are a number of different well known CFA's usable with at least some embodiments described herein, including but not limited to Bayer filters (a common RGB filter having a pattern with one blue, one red, an two green filter elements, in a given 2×2 pixel region); RBGE filter (similar to Bayer filter, but one of the green filter elements is an "emerald" green filter element); CYYM filter (one cyan, two yellow, one magenta filter elements, in a 2×2 pixel region); CYGM filter (one cyan, one yellow, one green, and one magenta filter element in a 2×2 pixel region); RGBW Bayer filter (similar to Bayer filter, but with one red, one green, one black, and one panchromatic (white or transparent) filter element); and other types of filters that are similar but can include more or less of any given color, as will be appreciated by those of skill in the art. In one embodiment, the RGBW filter (also referred to in the art as a PANchromatic filter) is the preferred filter. The cross sectional view in FIG. 4B (discussed further herein) illustrates a portion of a CFA 44, used in at least one embodiment. In one embodiment, the CFA is implemented as part of a photodiode circuit having front side illumination (FSI) (see, e.g., FIG. 5E). In a further embodiment, the CFA is implemented as part of a photodiode circuit having back side illumination (BSI) (see FIGS. 5A-5D). This is described further herein.

Figure 3A:
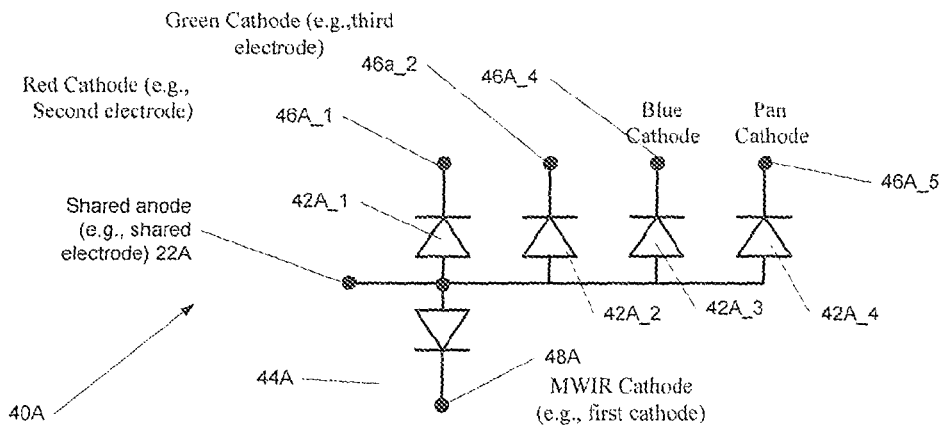
FIG. 3A is a first illustrative schematic of a total multispectral pixel, shared anode configuration, in accordance with one embodiment.
Figure 3B:
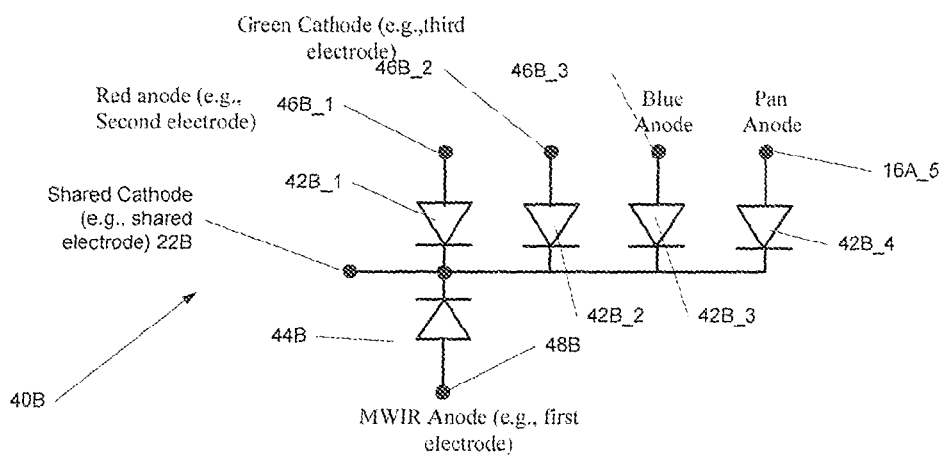
FIG. 3B is a second illustrative schematic of a total multispectral pixel, shared cathode configuration, in accordance with one embodiment.

FIG. 3A is a first illustrative schematic of a total multispectral pixel 40A, shared anode configuration, in accordance with one embodiment, and FIG. 3B is a second illustrative schematic of a total multispectral pixel 40B, shared cathode configuration, in accordance with one embodiment. It will be appreciated that the following discussion, associated with the shared cathode configuration 40B of FIG. 3B, is, of course, equally applicable to the shared anode configuration 40B of FIG. 3A, but with the appropriate terms reversed, etc.

As shown in FIG. 3B, the shared cathode 22B is coupled to a plurality of pixels 42B_1 through 42B_4, that each have their own respective anode 46B_1-46B-4, respectively, on one or both sides of the stacked structure 40B. That is, the shared cathode 22B serves as an anode for multiple different pixels 42B. The color filter array 54 (FIGS. 4A, 4B) is not illustrated in the schematics of FIGS. 3A, 3B, but is illustrated in FIGS. 4A-4E and 5A-5D. The color response of each respective pixel 42 results from the cascade of the filter (i.e., the CFA 54, as shown in FIGS. 4A-4D) and the sensor (i.e., that results from the photodiode used as a pixel 42).

In FIG. 3B, there is a red anode 46B_1, coupled to corresponding visible red pixel 42B_1, a green anode 46B_2, coupled to corresponding visible green pixel 42B_2, a blue anode 46B_3, coupled to corresponding visible blue pixel 42B_3, and a panchromatic ("Pan") anode 46B_4, coupled to a corresponding visible Pan pixel 42B_4. Note that, as is known in the art, panchromatic refers to responding to being sensitive to all visible colors in the spectrum, and can correspond to a white or transparent photodiode.

The stacked photodiode 40B of FIG. 3B also includes an MWIR pixel 44B with a corresponding MWIR anode 48B. The common cathode 22B is shared not only by all the visible pixels 42B_1 through 42B_3, but also by the MWIR pixel 44B. Advantageously, in one embodiment, there are two or more additional diodes that are operably connected to the shared electrode 22 (e.g., shared cathode 22B) along with the MWIR anode 48B, where each additional diode shares the electrode 22 (e.g., the shared electrode 22B) as its "shared" electrode, where the MWIR anode 48B serves as a "first" electrode, and where each of the additional diodes includes respective independent "second" electrodes that are responsive to shorter wavelengths than the first diode (only the red and green are specifically pointed out in FIG. 3B). Although 4 colors are shown in FIGS. 3B and 3A, this is not limiting, and the embodiments described herein can, of course, be implemented with fewer or more colors.

Top 50 and cross-sectional 52 views of the stacked photodiode 40B of FIG. 3B are also shown in FIGS. 4A and 4B, described further below.

Figures 4C, 4D:
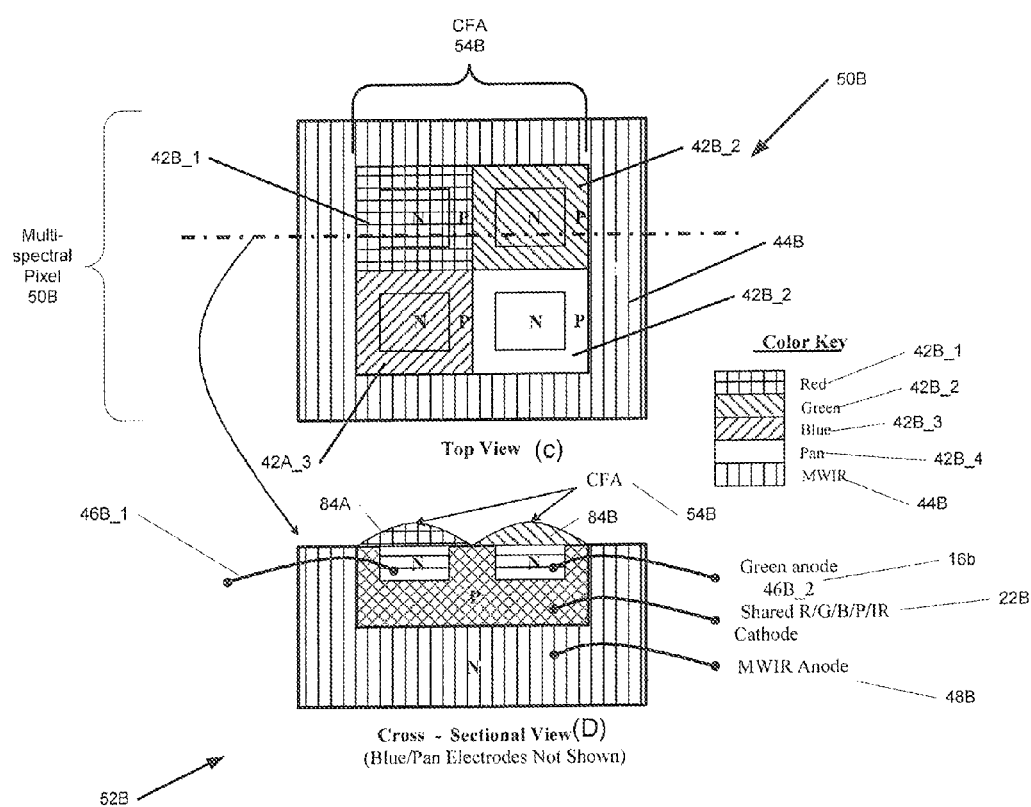
FIG. 4C is a top schematic view of a physical pixel layout, shared cathode configuration, for a second multispectral FSI pixel, in accordance with one embodiment.
FIG. 4D is a cross-sectional schematic view of the possible physical pixel layout of FIG. 4C, shared cathode configuration, for the second multispectral FSI pixel, taken along the A-A line, in accordance with one embodiment.

FIG. 4A is a top schematic view 50 of a physical pixel layout, shared anode configuration, for a first Front Side Illuminated (FSI) multispectral pixel, in accordance with one embodiment, and FIG. 4B is a cross-sectional schematic view 52 of one possible physical pixel layout of FIG. 4A, shared anode configuration, in accordance with one embodiment. FIG. 4C is a top schematic view of a physical pixel layout, shared cathode configuration, for a second FSI multispectral pixel, in accordance with one embodiment, and FIG. 4D is a cross-sectional schematic view of the possible physical pixel layout of FIG. 4C, shared cathode configuration, taken along the A-A line, in accordance with one embodiment. FIG. 4E is a cross-sectional schematic view of a physical pixel layout, shared anode configuration, for a third FSI pixel, showing the multi-layer wiring, implemented using a third multispectral pixel, including microlenses forming a color filter array (CFA), in accordance with one embodiment. Each of these embodiments is described further herein.

The shared anode configuration of FIGS. 4A, 4B, and 4E also is referred to as the P on N configuration, referring to which type of implant material is closest to the surface of the wafer. Similarly, the shared cathode configuration, as FIGS. 4B and 4C illustrates, is an N over P configuration. It will be appreciated that the configurations shown in any of FIGS. 4A-4E and 5A-5D can be part of a chip assembly, imager assembly, etc.

As with the description of FIG. 3B above, the following discussion is written primarily in terms of describing the shared cathode arrangement of FIG. 4B, but it will be appreciated that this discussion is equally applicable to the shared anode configuration of FIG. 4A, with the appropriate terms anode and cathode reversed, etc.

Referring first to FIG. 4B, a Red/Green/Blue/Pan (R/G/B/Pan) color filter array (CFA) 54B is shown in the center of the top view covering the N-over-P visible spectrum pixels (i.e., photodiodes), i.e., pixels 42A_1 (the red pixel), 42A_2 (the green pixel), 42A_3 (the blue pixel) and 42A_4 (the pan pixel), while the cathode end of the MWIR P-over-N pixel 44B is shown surrounding it. The CFA 54B includes a plurality of micro lenses 84, which correspond to the plurality of filters (e.g., color filters) formed over and/or on the CFA 54B, although only two micro lenses 84A (red) and 84B (green) are shown in the cross-sectional view of FIG. 4B. Micro lenses 84 can be formed in any known manner, such as by applying a layer of photoresist or polymer or other suitable material.

Other layers, not shown in FIG. 4B also may be used in connection with the micro lenses, such as planarizing or flattening layers, etc., as will be appreciated. For example, reference is now made briefly to FIG. 4E, which is a cross-sectional schematic view of a physical pixel layout, shared anode configuration, for a third FSI pixel, showing the set 72 of multi-layer wiring layers 74, 76, 78, 80, 82 that can be used in connection with a third multispectral pixel, including micro-lenses 84A, 84B forming a color filter array (CFA) 54A, in accordance with one embodiment. Each respective wiring layer 74, 76, 78, 80, 82 includes respective sets of various connections, e.g., 74A-74C, 76A-76C, 78A-78C, 80A-80C, and 82A-82C, respectively. These connections can include any one or more of electrical connections, vias, light guides to guide light through the layers, etc., as will be understood.

Referring to FIG. 4C, the cross-sectional view 52B illustrates the stacked pixel architectures (e.g., using the stacked photodiode architecture of FIG. 2B), and also shows the connections to some of the anodes 46B and the common cathode 22B. For clarity, certain elements, such as substrates, contacts, insulating layers, control circuits, etc., are not shown in this cross-sectional view 52B, but one of skill in the art will appreciate that these elements may be part of the stacked photodiode architecture 52A (e.g., as shown in FIG. 4E). The blue electrode and pan electrodes (i.e., blue anode 16c and pan anode 16d) are not shown or visible in this cross sectional view of FIG. 4B. The cross sectional view of FIG. 4B helps to illustrate how the visible pixels 42B_1-42B_2 are stacked and formed on top of the MWIR pixel 44B, how the anodes 46B are connected, how all the pixels share the common cathode 22B, and where the CFA 54B is disposed.

Figure 6:
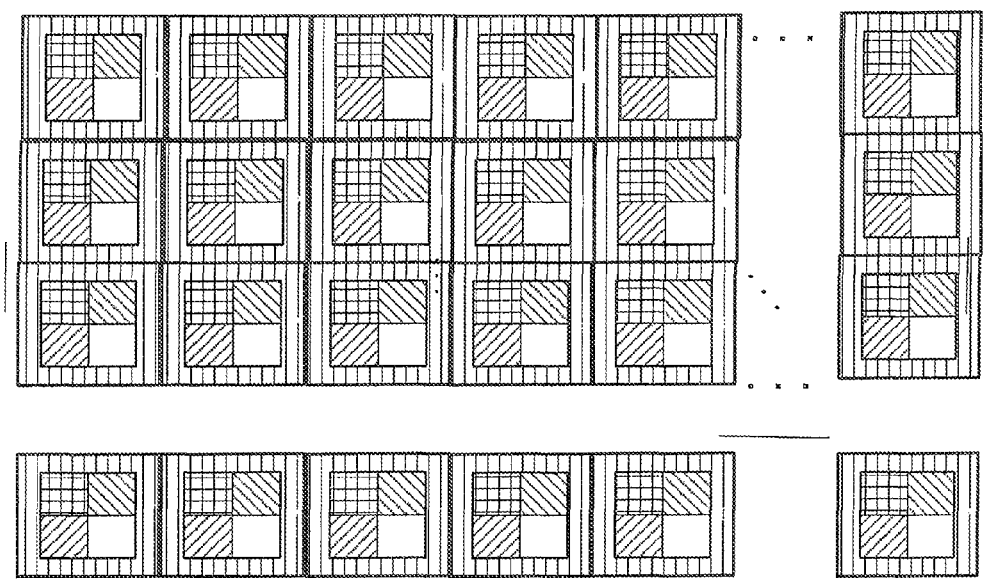
FIG. 6 is an exemplary illustration of a multispectral array of the multispectral pixels described herein.
Figure 6:

In one embodiment, a small N×M array of these multi-spectral pixels 50 of FIGS. 3A-3B and 4A-4D, is be fabricated as depicted in the example in FIG. 6 (described further herein), which is an exemplary illustration of a multispectral array 100, in accordance with one embodiment. Although corresponding support circuitry is not explicitly illustrated in FIG. 6, the appropriate support circuitry is known and can be implemented using known techniques and designs.

It should be understood that the shared electrode configurations described herein are equally applicable to Back Side Illuminated (BSI) pixel configurations as well as FSI pixel configurations. For example, FIG. 5A is a top schematic view of a physical pixel layout, shared anode configuration, for a first BSI multispectral pixel 100, in accordance with one embodiment, FIG. 5B is a cross-sectional schematic view 101 of the physical pixel layout 100 FIG. 5A, taken along the B-B line of FIG. 5A, including micro lenses 84A, 84B and a CFA 54A, in accordance with one embodiment, FIG. 5C is a top schematic view 120 of a physical pixel layout, shared cathode configuration, for a second BSI multispectral pixel, in accordance with one embodiment; and FIG. 5D is a cross-sectional schematic view 102 of a physical pixel layout, shared cathode configuration of FIG. 5C, taken along the B-B line of FIG. 5C, including micro lenses and a CFA, in accordance with one embodiment.

Figure 5A:
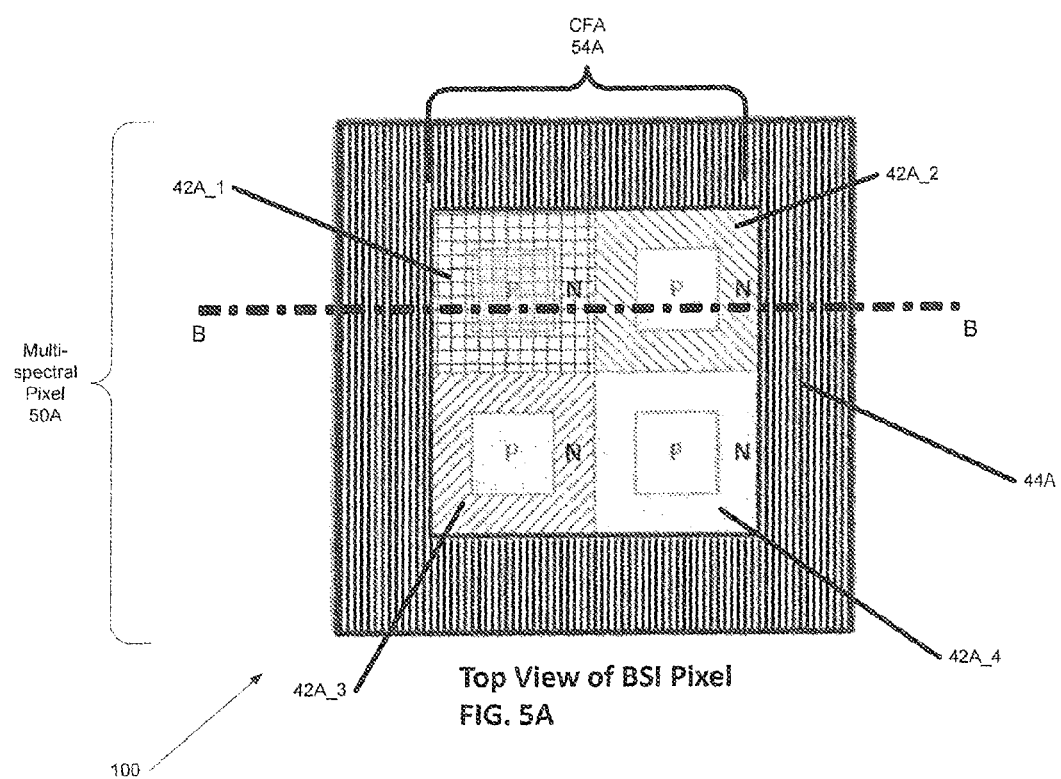
FIG. 5A is a top schematic view of a physical pixel layout, shared anode configuration, for a first Back Side Illuminated (BSI) multispectral pixel, in accordance with one embodiment.

The top view of the BSI pixel 100 of FIG. 5A is not unlike the top view of the multispectral FSA pixel 50A of FIG. 4B, at least as far as what can be illustrated in a top view, so description is not repeated here. One difference can be seen, however, in the cross-sectional view of FIG. 5B, as compared to the cross-sectional view of FIG. 4B. In the embodiment of FIG. 5B, it can be seen that the cross-sectional view 52A of FIG. 4B is, effectively, "inverted" in the BSA pixel configuration 101, of FIG. 5B. Thus, the shared anode embodiment of FIG. 4B is applicable not only in FSI configurations, but also BSI configurations.

Figure 5B:
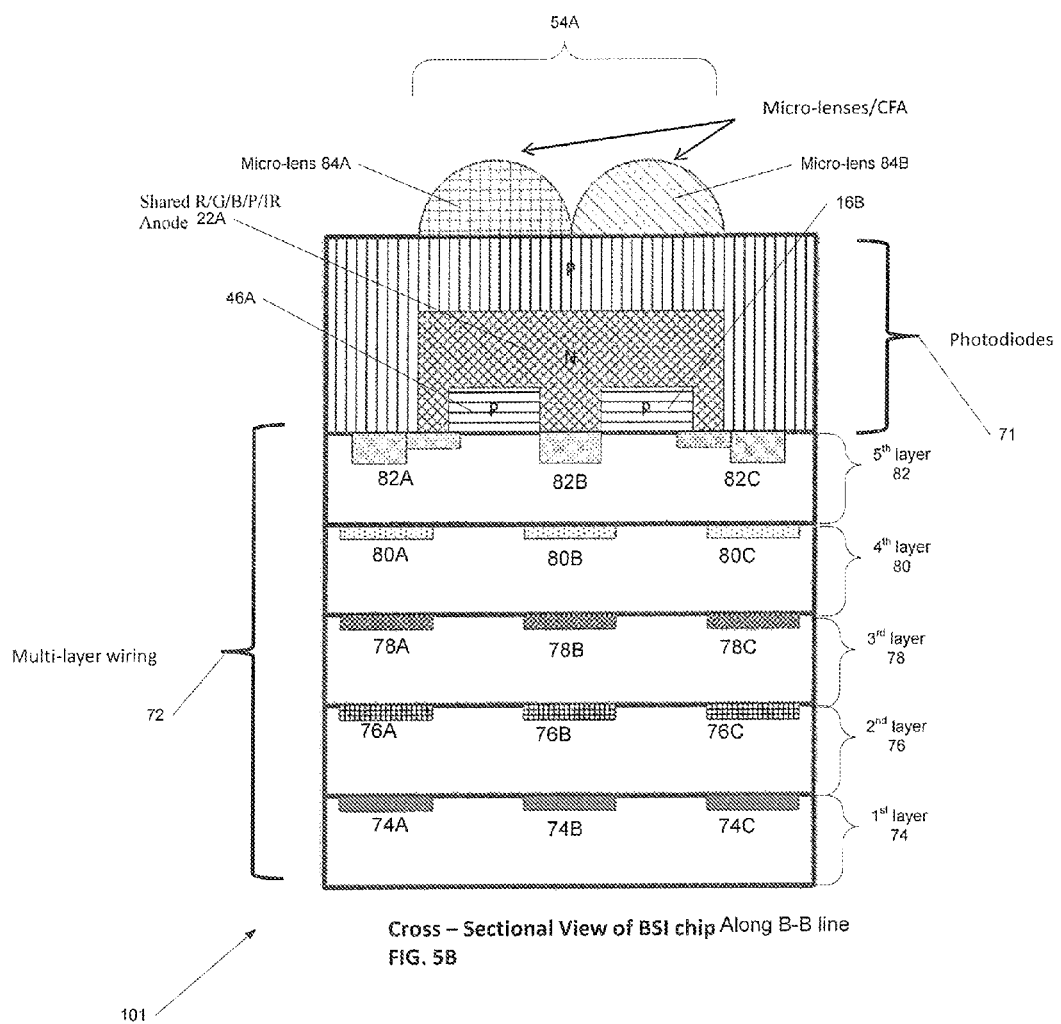
FIG. 5B is a cross-sectional schematic view of a physical pixel layout, shared anode configuration of FIG. 5A, taken along the B-B line of FIG. 5A, including micro lenses and a CFA, in accordance with one embodiment.
Figure 5C:
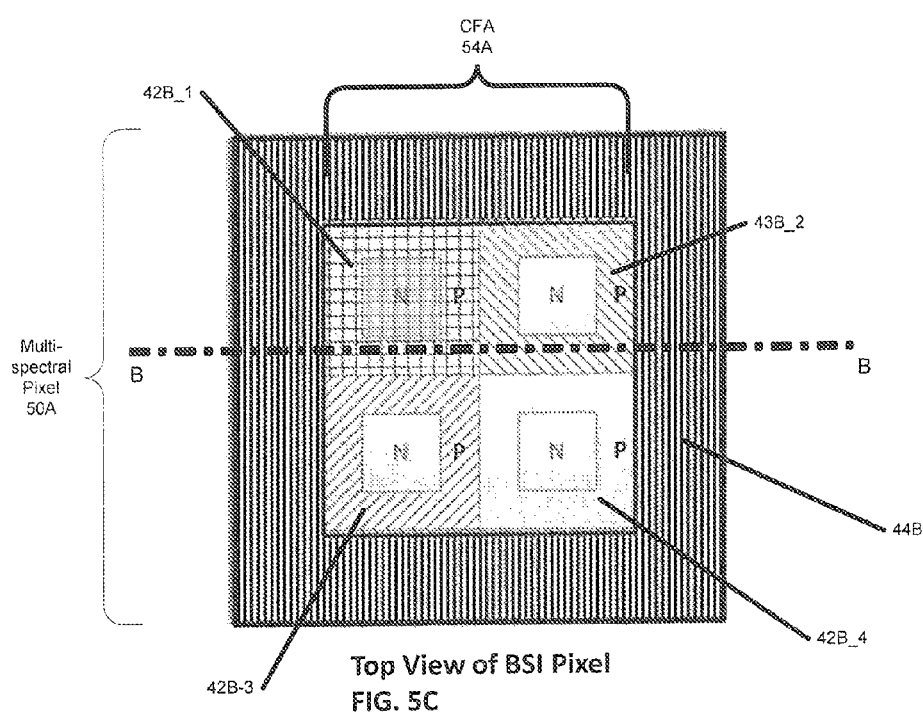
FIG. 5C is a top schematic view of a physical pixel layout, shared cathode configuration, for a second BSI multispectral pixel, in accordance with one embodiment.
Figure 5D:
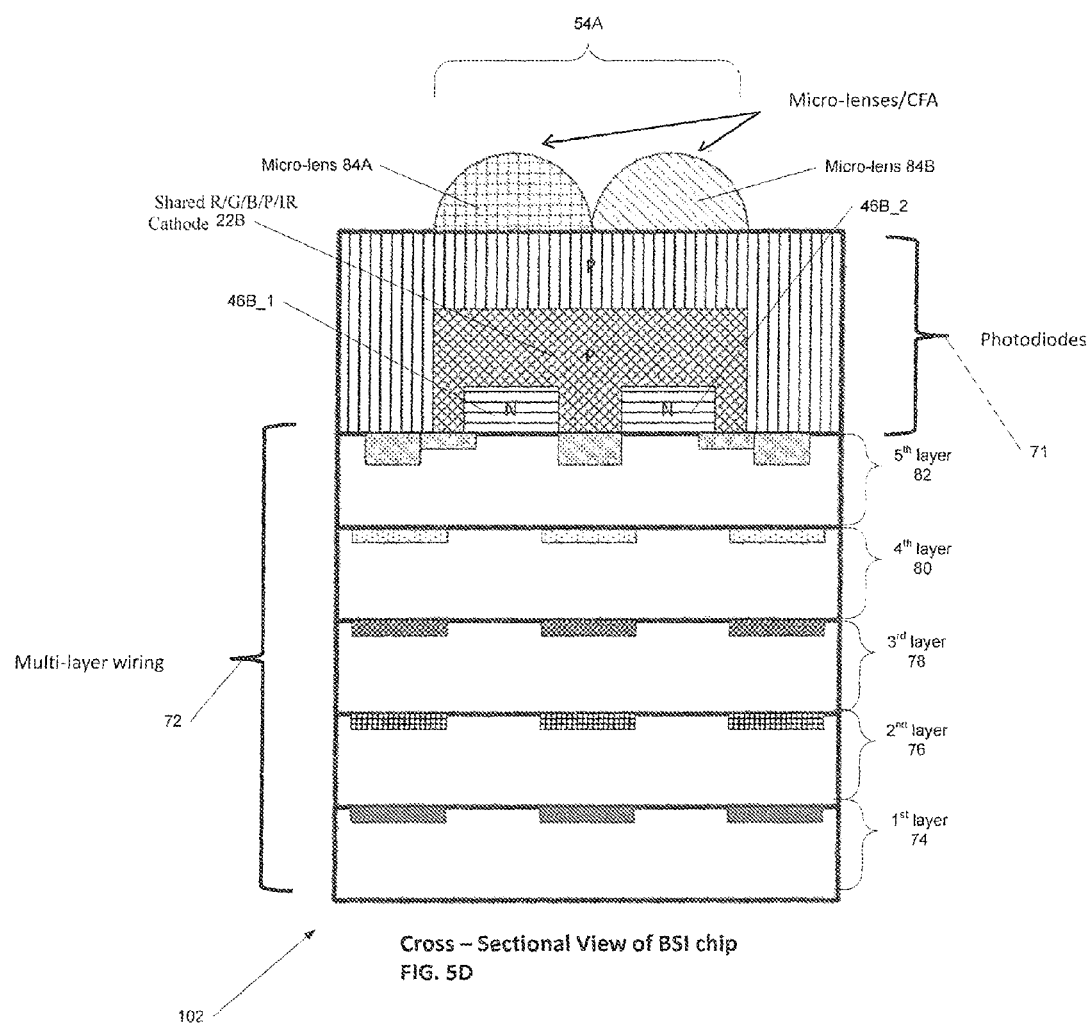
FIG. 5D is a cross-sectional schematic view of a physical pixel layout, shared cathode configuration of FIG. 5C, taken along the B-B line of FIG. 5C, including micro lenses and a CFA, in accordance with one embodiment.

Referring, for example, to FIG. 5B, it can be seen that the structure has some similarities with the FSI pixel of FIG. 4D, but the photodiode itself has been inverted in the BSI configuration as compared to the FSI configuration. Note that, in one embodiment of a BSI imaging configuration (e.g., FIGS. 5A-5D), the substrate on which the photodiode is formed is thinned and then the micro lenses/CFA array is added on top of the thinned substrate. In contrast, in one embodiment of an FSI imaging configuration (e.g., FIG. 4D) the micro lenses 84/CFA array 54 is added on top of the multi-layer wiring 72.

In the BSI configuration of FIGS. 5A-5D, the BSI photodiode imager configuration 71 die needs to be flipped before being mounted in the packages so that the micro lenses 84 are at the surface. Consequently, the micro lenses 84A, 84B are closer to the photodiodes. In some embodiments, this might require alterations in one or more of the micro lenses 84, to compensate for the shorter focal length between the micro lenses 84 and the photodiodes.

FIG. 6 is an exemplary illustration of a multispectral array of the multispectral pixels described herein. FIG. 6 is equally applicable to the FSI and BSI configurations described herein. For example, FIG. 6 in one embodiment corresponds to a multispectral array of the multispectral pixels of FIGS. 4A-4B. FIG. 6 in one embodiment corresponds to a multispectral array of the multispectral pixels of FIGS. 4C-4D. FIG. 6, in a further embodiment, corresponds to a multispectral array of the multispectral pixels of FIGS. 5A-5B. FIG. 6, in yet another embodiment, corresponds to a multispectral array of the multispectral pixels of FIGS. 5C-5D.

It is envisioned that the embodiments described herein also could be combined with some or all of the technologies described in the commonly assigned U.S. Pat. No. 7,215,270, entitled "Sigma-Delta Modulator having selectable OSR with Optimal Resonator Coefficient,"; U.S. Pat. No. 7,576,671, entitled "Mismatch-shaping Dynamic Element Matching Systems and Methods for Multi-bit Sigma-delta Data Converters,"; U.S. Pat. No. 7,605,652, entitled "Sigma-delta Based Class D Audio Power Amplifier with High Power Efficiency,"; U.S. Pat. No. 7,612,608, entitled "Sigma-delta Based Class D Audio or Servo Power Amplifier with Load Noise Shaping,"; U.S. Pat. No. 7,860,189, entitled "Hybrid Heterodyne Transmitters and Receivers," U.S. Pat. No. 8,379,760, entitled "Hybrid Heterodyne Transmitters and Receivers," U.S. Patent Publication US-2012-0218445-A1, entitled "Imager Readout Architecture Utilizing A/D Converters," (Now U.S. Pat. No. 9,001,234 and U.S. Pat. No. 9,369,651) and the commonly owned and invented application entitled Foveal Imager Readout Integrated Circuit (ROIC), application Ser. No. 61/879,276, by Eugene M. Petilli, filed on Sep. 18, 2013 (now U.S. Pat. No. 9,344,660, issued May 17, 2016). The contents of each of these patents and patent applications are hereby incorporated by reference in their entirety.

Throughout the present disclosure, absent a clear indication to the contrary from the context, it should be understood individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements have like or related alpha, numeric or alphanumeric designators. Further, while the present embodiments have been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Similarly, in addition, in the Figures of this application, in some instances, a plurality of system elements may be shown as illustrative of a particular system element, and a single system element or may be shown as illustrative of a plurality of particular system elements. It should be understood that showing a plurality of a particular element is not intended to imply that a system or method implemented in accordance with the disclosed embodiments must comprise more than one of that element, nor is it intended by illustrating a single element that any of the disclosed embodiments are limited to embodiments having only a single one of that respective elements. In addition, the total number of elements shown for a particular system element is not intended to be limiting; those skilled in the art can recognize that the number of a particular system element can, in some instances, be selected to accommodate the particular user needs.

In describing the embodiments illustrated in the figures, specific terminology (e.g., language, phrases, etc.) may be used for the sake of clarity. These names are provided by way of example only and are not limiting. The disclosed embodiments are not limited to the specific terminology so selected, and each specific term at least includes all grammatical, literal, scientific, technical, and functional equivalents, as well as anything else that operates in a similar manner to accomplish a similar purpose. Furthermore, in the illustrations, Figures, and text, specific names may be given to specific features, processes, military programs, etc. Such terminology used herein, however, is for the purpose of description and not limitation.

Although the disclosed embodiments have been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the embodiments described herein. Those of ordinary skill in the art will appreciate that at least some of the embodiments described herein can be modified to accommodate and/or comply with changes and improvements in the applicable technology and standards referred to herein. Variations, modifications, and other implementations of what is described herein can occur to those of ordinary skill in the art without departing from the spirit and the scope as claimed. In addition, the technology disclosed herein can be used in combination with other technologies. Accordingly, the foregoing description is by way of example only and is not intended as limiting. In addition, all publications and references cited herein are expressly incorporated herein by reference in their entirety.

Having described and illustrated the principles of the technology with reference to specific implementations, it will be recognized that the technology can be implemented in many other, different, forms, and in many different environments. Having described the preferred embodiments, it will now become apparent to one of ordinary skill in the art that other embodiments incorporating their concepts may be used. These embodiments should not be limited to the disclosed embodiments, but rather should be limited only by the spirit and scope of the appended claims. The scope of the embodiments described herein is defined in the following claims and the equivalents thereto.

What is claimed is:

1. A photodiode architecture, comprising:
   a first photodiode comprising first and second electrodes, the first electrode being coupled to a shared electrode;
   a second photodiode operably connected in series with the first photodiode, the second photodiode being independent of the first photodiode, comprising third and fourth electrodes, the third electrode being coupled to the shared electrode; and
   a third photodiode operably connected in series with the first photodiode, the third photodiode being independent of the first photodiode and comprising fifth and sixth electrodes, and the fifth electrode being coupled to the shared electrode;
   wherein the shared electrode is in operable communication with the first electrode, third electrode, and fifth electrode;
   wherein the shared electrode is configured to operate, respectively, as either a shared anode or a shared cathode for the respective first, second, and third photodiodes, wherein the photodiode architecture comprises at least one of a shared anode photodiode architecture and a shared cathode photodiode architecture; and
   wherein the first photodiode, second photodiode, third photodiode and shared electrode are constructed and arranged to selectively reverse bias the first, second, and third photodiodes so that, during operation, at least one of the first, second and third photodiodes is operating in a photoconducting mode, to enable capture and storage of charge from any photodiode in the photodiode architecture that is operating in photoconducting mode.

2. A photodiode architecture, comprising:
   a first photodiode comprising first and second electrodes, the first electrode being operably coupled to a shared electrode;

a second photodiode operably connected in series with the first, photodiode, the second photodiode being independent of the first photodiode, comprising third and fourth electrodes, the third electrode being operably coupled to the shared electrode; and a third photodiode operably connected in series with the first photodiode, the third photodiode being independent of the first photodiode and comprising fifth and sixth electrodes, and the fifth electrode being coupled to the shared electrode;

wherein the shared electrode is configured to operate as either a shared anode or a shared cathode for the respective first, second, and third photodiodes; and wherein the first photodiode, second photodiode, third photodiode and shared electrode are constructed and arranged so that, during operation, at least one of the first, second and third photodiodes is always operating in a photoconducting mode.

3. The photodiode architecture of claim 2, wherein the photodiode architecture is configured as part of a back-side illumination device.

4. The photodiode architecture of claim 2, wherein the first photodiode is configured to respond to a first wavelength of light and at least one of the second and third photodiodes is configured to be responsive to a respective second or third wavelength of light that is shorter than the first wavelength of light.

5. The photodiode architecture of claim 2, wherein at least one of the first, second, and third photodiodes is configured to be responsive to non-visible light and at least one of the first, second and third photodiodes is configured to be responsive to visible light.

6. The photodiode architecture of claim 2, wherein the second and third photodiodes are each constructed and arranged to be responsive to a respective one of visible red light, visible green light, visible blue light, and visible panchromatic light.

7. The photodiode architecture of claim 2, wherein the first photodiode is constructed and arranged to be responsive to any one of infrared light, near infrared (NIR) light, short-wavelength infrared (SWIR) light, long wavelength infrared (LWIR) light, ultraviolet (UV) light, radio wave light, x-ray wave light, and gamma ray light.

8. The photodiode architecture of claim 2, wherein any two of the first, second, and third photodiodes are responsive to the same type of light.

9. The photodiode architecture of claim 2, further comprising a color filter array (CFA) configured to be in operable communication with the first, second, and third photodiodes.

10. The photodiode architecture of claim 2, wherein the first, second, and third photodiodes are arranged in a stacked configuration.

11. The photodiode architecture of claim 2, wherein the photodiode architecture is implemented as part of at least one of an image capture device and an image fusion system.

12. The photodiode architecture of claim 2, wherein the photodiode architecture is configured as part of a front-side-illumination device.

13. The photodiode architecture of claim 2, wherein, during operation of the photodiode architecture, the shared electrode is configured to selectively reverse bias at least one of the first, second, and third photodiodes.

14. A method for capturing an image, the method comprising:

providing a first photodiode having first and second electrodes;

coupling the first electrode to a shared elect ode;

operably connecting a second photodiode in series with the first photodiode, the second photodiode being independent of the first photodiode and having third and fourth electrodes and the third electrode being coupled to the shared electrode;

operably connecting a third photodiode in series with the first photodiode, the third photodiode being independent of the first photodiode and comprising fifth and sixth electrodes, the fifth electrode being coupled to the shared electrode, wherein the shared electrode is in operable communication with the first, third, and fifth electrodes;

configuring the first photodiode to respond to a first wavelength of light and at least one of the second, and third photodiodes to be responsive to a respective second or third wavelength of light that is shorter than the first wavelength of light;

configuring an electrode node that is in operable communication with the first electrode and the third electrode to be a shared electrode that is configured to operate, respectively, as either a shared anode or a shared cathode for the first, second, and third photodiodes, respectively, wherein the photodiode architecture comprises at least one of a shared anode photodiode architecture and a shared cathode photodiode architecture, wherein the shared electrode node is configured to operate, respectively, as either a shared anode node or a shared cathode node; and constructing and arranging the first photodiode, second photodiode, third photodiode, and shared electrode so that, during operation, at least one of the first, second, and third photodiodes is always operating in a photoconducting mode, to enable capture and storage of charge from any photodiode in the photodiode architecture that is operating photoconducting mode.

15. The method of claim 14, further comprising configuring at least one of the first, second, and third photodiodes to be responsive to nonvisible light and at least one of the first, second and third photodiodes to be responsive to visible light.

16. The method of claim 14, further comprising constructing and arranging the second and third photodiodes to be responsive to a respective one of visible red light, visible green light, visible blue light, and visible panchromatic light.

17. The method of claim 14, further comprising constructing and arranging the first photodiode to be responsive to any one of infrared light, near infrared (NIR) light, short-wavelength infrared (SWIR) light, long wavelength infrared (LWIR) light, ultraviolet (UV) light, radio wave light, x-ray wave light, and gamma ray light.

18. The method of claim 14, further comprising configuring a color filter array (CFA) to be in operable communication with the first, second, and third photodiodes.

19. The method of claim 14, further comprising configuring a photodiode architecture formed at least by the first, second, and third photodiodes and the shared electrode, to be part of at least one of a front-side-illumination device and a back side illumination device.

20. The method of claim 14, further comprising selectively reverse biasing at least one of the first, second, and third photodiodes to ensure that, during operation, at least one of the first, second, and third photodiodes is operating in a photoconducting mode.

* * * * *

UNITED STATES PATENT AND TRADEMARK OFFICE
CERTIFICATE OF CORRECTION

| | | |
|---|---|---|
| PATENT NO. | : 9,595,558 B2 | |
| APPLICATION NO. | : 14/539607 | |
| DATED | : March 14, 2017 | |
| INVENTOR(S) | : Eugene M. Petilli | |

It is certified that error appears in the above-identified patent and that said Letters Patent is hereby corrected as shown below:

In the Specification

Column 1, Line 26 delete "including but not limited to" and replace with --including but not limited to,--.

Column 1, Line 32 delete "(hereinafter "'445..." and replace with --hereinafter "'445..."--.

Column 1, Lines 59-60 delete "pn junction," and replace with --p-n junction,--.

Column 4, Line 31 delete "application is of" and replace with --application of--.

Column 4, Line 40 delete "(UAVs))," and replace with --(UAVs),--.

Column 10, Lines 10-11 delete "that that" and replace with --that--.

Column 10, Line 52 delete "and, and, thus" and replace with --and, thus,--.

Column 12, Line 9 delete "46B_1-46B-4," and replace with --46B_1-46B_4,--.

Column 14, Line 51 delete "FIG. 6 in one embodiment" and replace with --FIG. 6, in one embodiment,--.

Signed and Sealed this
First Day of May, 2018

Andrei Iancu
*Director of the United States Patent and Trademark Office*